United States Patent
Chen et al.

(10) Patent No.: US 6,518,166 B1
(45) Date of Patent: Feb. 11, 2003

(54) LIQUID PHASE DEPOSITION OF A SILICON OXIDE LAYER FOR USE AS A LINER ON THE SURFACE OF A DUAL DAMASCENE OPENING IN A LOW DIELECTRIC CONSTANT LAYER

(75) Inventors: Sheng Hsiung Chen, Taichung (TW); Shun Long Chen, Hsin-Chu (TW); Hungtse Lin, Nan-tou (TW); Frank Hsu, Hsin-Chu (TW); Tsu Shih, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 5 days.

(21) Appl. No.: 09/839,700

(22) Filed: Apr. 23, 2001

(51) Int. Cl.[7] .......................................... H01L 21/4763
(52) U.S. Cl. ..................... 438/622; 438/706; 438/590; 438/723; 438/724; 438/623; 438/638; 438/627; 438/637; 438/618
(58) Field of Search ................................ 438/706, 590, 438/723, 724, 622–623, 638, 627, 637, 618

(56) References Cited

U.S. PATENT DOCUMENTS

| | | | |
|---|---|---|---|
| 5,453,395 A | | 9/1995 | Lur ................................ 437/67 |
| 5,567,660 A | | 10/1996 | Chen et al. ................... 437/231 |
| 5,612,239 A | | 3/1997 | Lin et al. ........................ 437/44 |
| 5,932,487 A | | 8/1999 | Lou et al. ..................... 438/692 |
| 6,010,955 A | * | 1/2000 | Hashimoto ................... 438/597 |
| 6,091,130 A | * | 7/2000 | Oyamatsu et al. ........... 257/619 |
| 6,100,184 A | * | 8/2000 | Zhao et al. ................... 438/638 |
| 6,187,661 B1 | * | 2/2001 | Lou .............................. 438/622 |
| 6,268,294 B1 | * | 7/2001 | Jang et al. .................... 438/706 |
| 6,284,657 B1 | * | 9/2001 | Chooi et al. ................. 438/687 |
| 6,291,333 B1 | * | 9/2001 | Lou .............................. 438/618 |
| 6,294,832 B1 | * | 9/2001 | Yeh et al. ..................... 257/751 |
| 6,187,663 B1 | * | 2/2002 | Yu et al. ....................... 438/624 |
| 6,350,675 B1 | * | 2/2002 | Chooi et al. ................. 438/624 |
| 6,365,508 B1 | * | 4/2002 | Zhou et al. ................... 438/627 |
| 6,388,330 B1 | * | 4/2002 | Ngo et al. .................... 257/760 |

FOREIGN PATENT DOCUMENTS

JP  2000150519 A  *  5/2000  ........ H01L/21/3205

* cited by examiner

Primary Examiner—Matthew Smith
Assistant Examiner—V. Yevsikov
(74) Attorney, Agent, or Firm—George O. Saile; Stephen B. Ackerman

(57) ABSTRACT

A process for forming a dual damascene opening, in a composite layer comprised with low k layers, to accommodate a dual damascene type, copper structure, has been developed. The process features the use of a silicon oxide layer, formed on the surfaces of the composite layer, exposed in the narrow diameter, via hole component of the dual damascene opening. The silicon oxide layer prevents via poisoning, or outgassing of amines or hydroxyls from the low k layers exposed in the via hole opening, that can evolve during a subsequent photolithographic development cycle, used to define the trench shape component of the dual damascene opening. The protective silicon oxide layer is conformally formed on the exposed-surfaces of the via hole component, via a liquid phase deposition procedure, performed at room temperature.

19 Claims, 3 Drawing Sheets

LIQUID PHASE DEPOSITION OF A SILICON OXIDE LAYER FOR USE AS A LINER ON THE SURFACE OF A DUAL DAMASCENE OPENING IN A LOW DIELECTRIC CONSTANT LAYER

BACKGROUND OF THE INVENTION (1) Field of the Invention

The present invention relates to methods used to fabricate semiconductor devices, and more specifically to a method used to protect a via hole opening, in a low dielectric constant (low k), layer, from a subsequent photoresist development procedure.

(2) Description of Prior Art

The objective of the semiconductor industry to continually improve the performance of semiconductor chips, has led to the use of copper metal interconnect structures, as well as to the use of low dielectric constant (low k), layers, such as fluorinated silica glass (FSG), or hydrogen silsesquioxane, (HSQ), featuring dielectric constants of about 2.9, for these low k, interlevel dielectric (ILD), layers. The performance enhancement is realized via reduction of RC delay constant for the semiconductor chip, via use of lower resistivity copper, when compared to counterparts fabricated with more resistive aluminum or tungsten, as well as lower capacitance resulting from the use of low k layers, when compared to counterparts employing higher dielectric layers such as silicon oxide. However the definition of dual damascene type openings, formed in low k layers, used to accommodate metal structures, can however encounter specific contamination problems during the opening of the dual damascene shape. One such contamination problem encounter during a dual damascene opening, in low k layers, is a via poisoning phenomena. After formation of the narrow diameter, via hole component of the dual damascene opening, in the low k layer, using a first photoresist shape and a dry etching procedure, the first photoresist shape is removed and a second photoresist shape, featuring a wide diameter opening, is formed to supply the masking needed to allow another dry etching procedure to create the trench shape component of the dual damascene opening, in a top portion of the low k layer. However during the development cycle of the second photoresist shape, unwanted release of amine, or hydroxyl type elements components, evolving from the low k layer exposed in the via hole shape, can poison the narrow diameter opening by formation of unwanted products, such as organic type mushroom shapes. The unwanted mushroom type shapes, now located in the via hole shape, adversely influence the ability to form a metal, or copper structure, in that via hole component of the dual damascene opening.

An option available for preventing evolution of amine or hydroxyl type species, from the low k layer during development of the dual damascene, trench shape, is the use of a silicon oxide layer deposited on the surfaces of the low k layer, exposed in the narrow diameter, or via hole component, of the dual damascene opening. The minimum thickness of the silicon oxide liner needed to prevent via hole poisoning, has been found to be about 500 Angstroms. Therefore to obtain a conformal, 500 Angstrom, silicon oxide liner, a deposition mode such as a conformal, low pressure chemical vapour deposition (LPCVD), procedure, is needed. However the elevated temperatures used for the LPCVD procedure would result in degradation to existing metal structures. Other deposition procedures, such as a plasma enhanced chemical vapour deposition (PECVD), procedure, although employing lower deposition temperatures, do not offer the conformality, or step coverage, needed to adequately protect the low k layer, exposed in the via hole shape.

The present invention will therefore describe a novel procedure for forming a silicon oxide liner layer, for a dual damascene application, via use of a liquid phase deposition (LPD), mode. The LPD deposition of the silicon oxide liner on the surfaces of the low k layer, exposed in the via hole component of the dual damascene opening, in accomplished with excellent conformality, and performed at a temperature in which degradation of existing metal structures is avoided. Prior art, such as Lin et al, in U.S. Pat. No. 5,612,239, describe an LPD procedure used to selectively form a silicon oxide layer on exposed silicon surfaces, for subsequent insulator spacer formation. That prior art however does not describe the novel application of this present invention, featuring the use of the LPD silicon oxide liner at a specific stage of formation of a dual damascene opening in a low k layer.

SUMMARY OF THE INVENTION

It is an object of this invention to form a copper interconnect structure and a copper via structure in a dual damascene opening, located in a low k layer.

It is another object of this invention to coat the surfaces of the low k layer, exposed in the via hole component, of the dual damascene opening, with.a silicon oxide layer, prior to the photolithographic procedure used to define the trench opening component of the dual damascene opening.

It is still another object of this invention to use a liquid phase deposition (LPD), procedure to form the silicon oxide layer on the surfaces of the low k layer, exposed in the via hole opening component of the dual damascene opening.

In accordance with the present invention a method of forming a dual damascene opening in a low k layer, featuring a silicon oxide layer used to coat the surfaces of the via hole component of the dual damascene opening, prior to the formation of the trench opening component shape of the same dual damascene opening, is described. A composite low k layer, comprised of an underlying low k layer, a thin silicon nitride stop layer, and an overlying low k layer, is formed on an underlying, lower level, metal interconnect structure. A first photoresist shape is used as an etch mask to allow a first dry etch procedure to define a narrow diameter, via hole opening, in the composite low k layer, exposing a portion of the top surface of the lower level, metal interconnect structure. After removal of the first photoresist shape a conformal, silicon oxide layer is formed, via a low temperature, liquid phase deposition (LPD), procedure, on portions of the composite low k layer, exposed in the via hole opening, as well as formation of the silicon oxide layer on the lower level, metal interconnect structure exposed at the bottom of the via hole opening. A second photoresist shape is then used as an etch mask to allow a second dry etch procedure to define a wide diameter, trench shape opening in the overlying low k layer, with the selective second dry etch procedure terminating at the appearance of the thin silicon nitride stop layer. The second dry etch procedure also exposes a portion of the top surface of the lower level, metal interconnect structure, via selective removal of the portion of LPD silicon oxide located on the bottom of the via hole opening. The resulting dual damascene opening, comprised of a wide diameter, trench opening component, in the overlying low k layer, and comprised of a narrow diameter, via hole opening component, featuring LPD silicon oxide spacers, located in the thin silicon nitride stop layer, and in the underlying low k layer, is the used to accommodate a dual damascene type, copper structure.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

Figure 1:
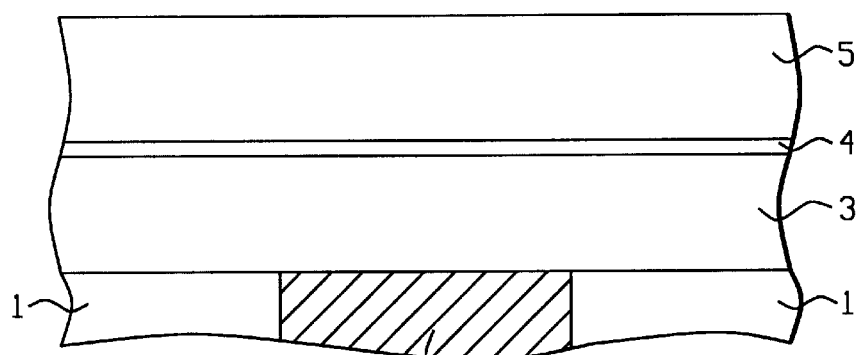
FIGS. 1, 2, 4–7, which schematically, in cross-sectional style, show the formation of a dual damascene opening, in a composite low k layer, used to accommodate a dual damascene type copper structure, featuring the use of an LPD silicon oxide layer, in turn used to coat the surfaces of the composite low k layer, exposed in a via hole opening component of the dual damascene opening, prior to the procedure used for definition of the trench shape opening component of the dual damascene opening.

The method of forming a dual damascene opening in a composite low k layer, used to accommodate a dual damascene type copper structure, and featuring the use of a liquid phase deposited, silicon oxide layer, formed on the surfaces of the composite low k layer exposed in the via hole opening component of the dual damascene opening, with the LPD silicon oxide layer used to prevent outgassing from the exposed low k layer during the photolithographic procedure used to define the trench shape opening component of the dual damascene opening, will now be described in detail. A lower level metal interconnect structure 2, comprised of a metal such as aluminum, tungsten, or copper, is schematically shown in FIG. 1, embedded in insulator layer 1, which can be comprised of a low k layer such as hydrogen silsesquioxane (HSQ), or comprised of a either silicon oxide or borophosphosilicate glass (BPSG). A composite low k layer is next formed, overlying lower level metal interconnect structure 2. The attainment of the composite low k layer is initiated by application of an underlying low k layer 3, such as HSQ, featuring a dielectric constant between about 2.8–3.0, applied via spin on procedures, at a thickness between about 3000 to 30000 Angstroms. A thin silicon nitride layer 4, is then deposited on underlying low k layer 3, at a thickness between about 50 to 100 Angstroms, via a plasma enhanced chemical vapour deposition (PECVD), procedure. Silicon nitride layer 4, will function as a stop layer for a subsequent dry etch procedure used to form a dual damascene opening in the composite low k layer. The completion of the composite low k layer is accomplished via application of an overlying low k layer 5, again such as HSQ, formed on silicon nitride layer 4, at a thickness between about 3000 to 30000 Angstroms, again applied via spin on procedures. The results of the deposition and application of these insulator layers is schematically shown in FIG. 1. If desired a fluorinated silica glass (FSG), layer can be used in place of the HSQ layers.

Figure 2:
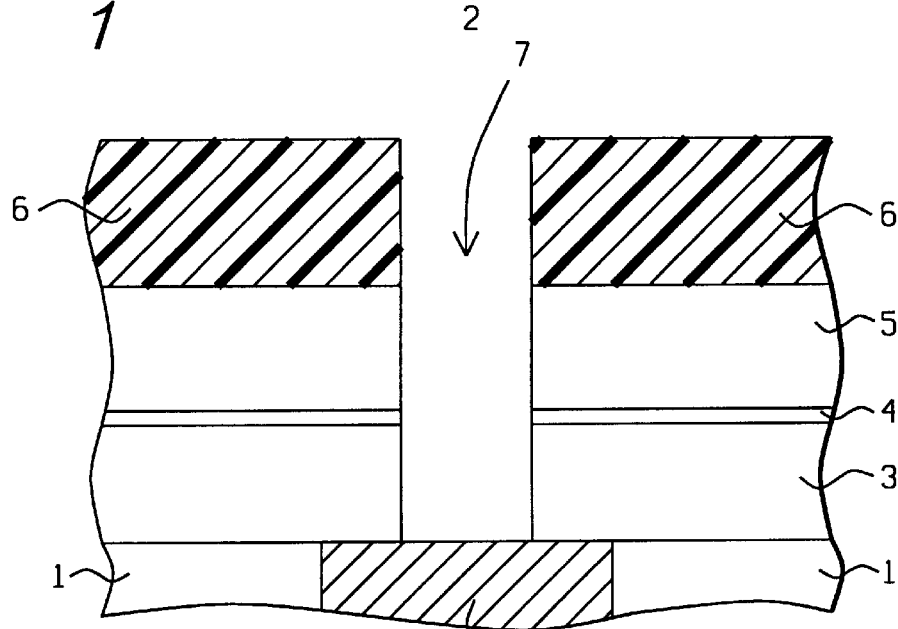

The process for creating of a dual damascene opening in the composite low k layer, used to accommodate a subsequent dual damascene type copper structure, initiated with the formation of via hole component 7, is described schematically in FIG. 2. Photoresist shape 6, is formed and used as an etch mask to allow a anisotropic, reactive ion etching (RIE), procedure, to define via hole opening 7, in the composite low k layer, using $CHF_3$ as an etchant for both overlying low k layer 5, and underlying low k layer 3, while $CF_4$ or $Cl_2$ is used to define the via hole opening component in silicon nitride layer 4. Via hole component 7, with a narrow diameter between about 100 to 10000 Angstroms, exposes a portion of the top surface of lower level metal interconnect structure 2. Photoresist shape 6, is then removed via plasma oxygen ashing and careful wet cleans.

The next phase of forming a dual damascene opening would be the creation of the wider diameter trench shape component of the dual damascene opening, in overlying low k layer 5, while silicon nitride layer 4, prevented a selective RIE procedure from etching underlying low k layer 3, thus preserving the narrow diameter via hole component in underlying low k layer 3. However the formation of the photoresist shape, needed for definition of the trench shape component of the dual damascene opening, entails a development cycle used to remove exposed regions of this photoresist shape. During the development cycle, performed in an alkaline solution such as KOH, elements or reactants, such as amines or hydroxyls are leached out of the regions of the low k layers, redepositing as residue at the bottom of via hole component 7. This phenomena, referred to as via hole poisoning can lead to process difficulties during the development cycle, as well as interfering with contact of a subsequent copper structure to underlying lower level metal interconnect structure 2, increasing the interface resistance between these conductive layers.

Figure 3:
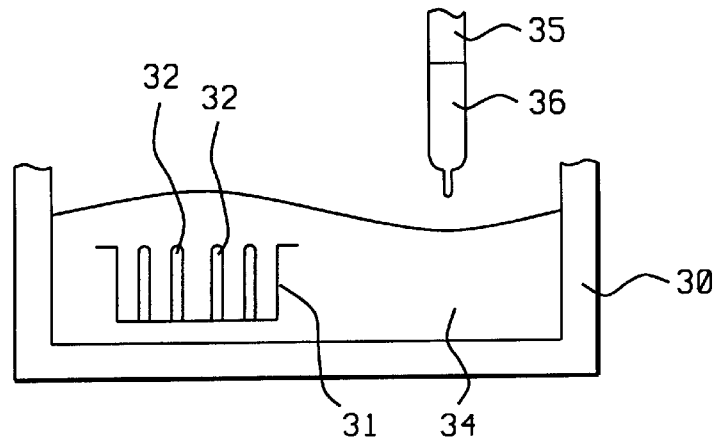
FIG. 3, which schematically shows the apparatus and reactants used to form the liquid phase deposited silicon oxide layer.

An approach used to prevent leaching or outgassing of unwanted materials from the exposed low k layer, during the trench shape, photolithographic procedure, is the use of an insulator layer formed on the regions of the low k layer, exposed in the via hole component. However the use of a low pressure chemical vapour deposition (LPCVD), procedure, used to deposit a conformal, protective silicon oxide layer on the low k layer, entails deposition temperatures too high to allow the lower level metal interconnect structure to survive, while lower temperature deposition procedures, such as PECVD, do not provide adequate conformality to effectively protect the entire low k layer, exposed in the narrow diameter, via hole component. Therefore a novel liquid phase deposition (LPD), procedure is performed at room temperature, to form a conformal silicon oxide layer on exposed low k regions. FIG. 3, schematically shows the apparatus and chemistry, used to obtain a conformal silicon oxide layer. A vessel 30, is used to accommodate $H_2SiF_6$ solution 34, maintained at room temperature. A wafer carrier 31, carrying semiconductor wafers 32, is immersed in $H_2SiF_6$ solution 34, followed by titration of $H_3BO_3$ solution 36, from pipette tube 35, resulting in the precipitation of silicon oxide. The amount of product, or the thickness of silicon oxide formed during this procedure is a function of the rate of titration. In addition the level of fluorine in the LPD silicon oxide layer can be reduced using specific LPD conditions, resulting in a reduction of the dielectric constant of the LPD silicon oxide layer The chemistry of this procedure is as follows:

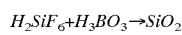

$$H_2SiF_6+H_3BO_3 \rightarrow SiO_2$$

Figure 4:
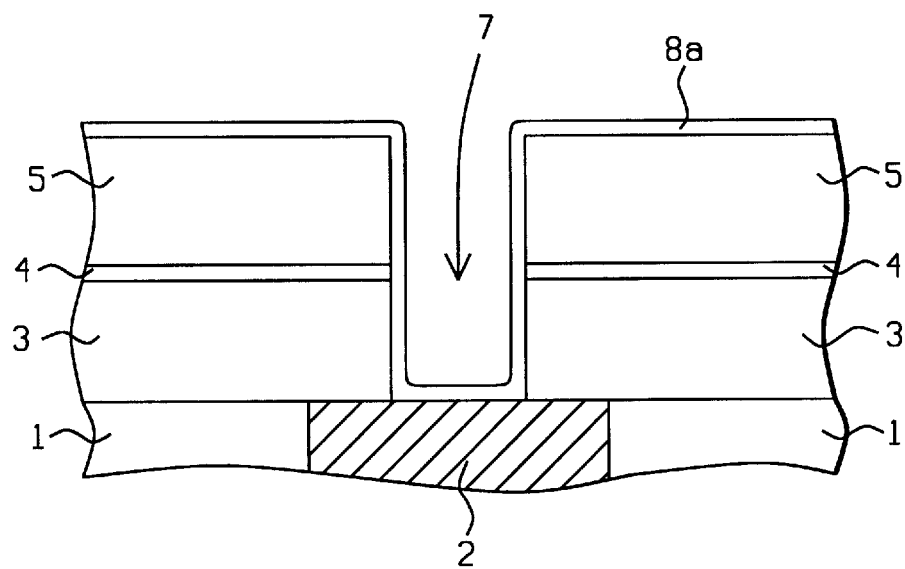

FIG. 4, schematically shows conformal silicon oxide layer 8a, at a thickness between about 20 to 200 Angstroms, is formed via the LPD procedure on the top surface of overlying low k layer 5, on the portion of lower level metal interconnect structure 2, exposed at the bottom of via hole component 7, and of greatest importance on the surfaces of the low k layers, exposed in via hole component 7. If desired an insulator layer, other then silicon oxide, such as silicon oxynitride, silicon nitride, or a boro, or borophosphosilicate glass, can also be conform ally formed via the low temperature, LPD procedure, to be used for the identical application described for the LPD silicon oxide layer.

Figure 5:
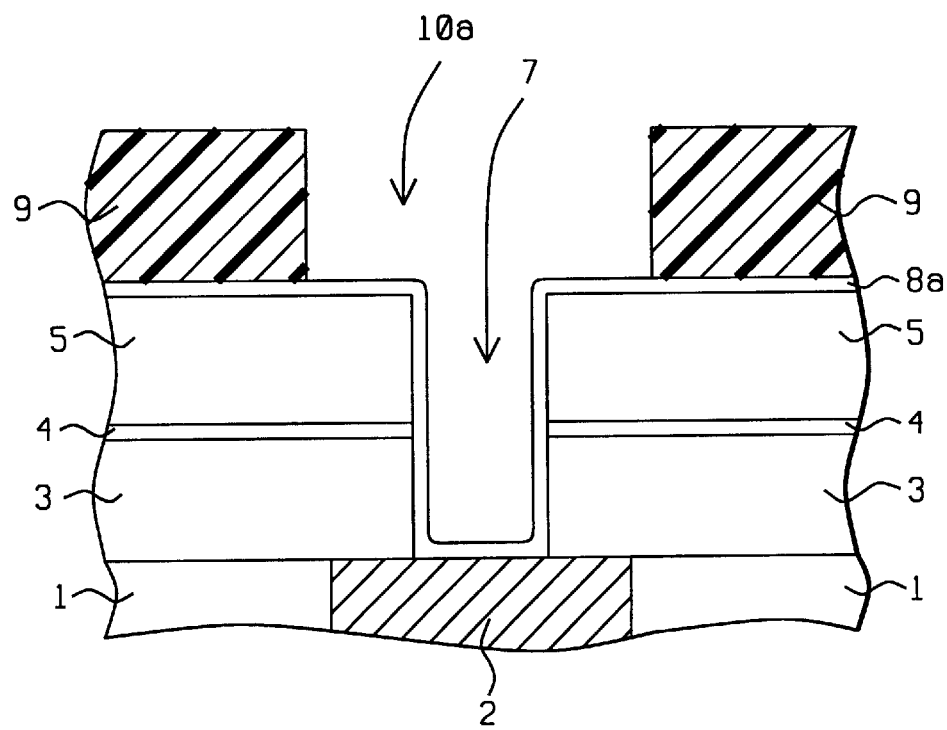

Photoresist shape 9, shown schematically in FIG. 5, is now formed overlying a portion of silicon oxide layer 8a, in a region in which silicon oxide layer 8a, overlays the top surface of overlying low k layer 5. Photoresist shape 9, is comprised with opening 10a, which will be used to define the trench shape component of the dual damascene opening. Photoresist shape 9, was formed via a photolithographic exposure procedure, followed by removal of exposed regions, via alkaline development procedures, forming opening 10a. Silicon oxide layer 8a, obtained via LPD procedures, protected the regions of low k layers, or prevented outgassing from low k layers, exposed in via hole component 7, during the development of opening 10a, thus preventing the via poisoning phenomena.

Figure 6:
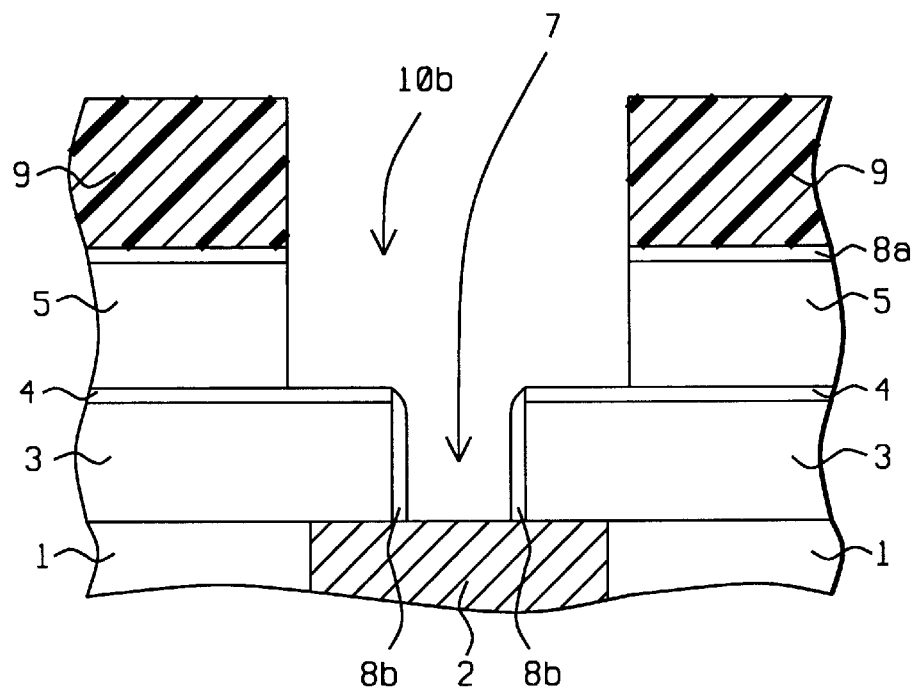

The creation of the: trench shape component 10b, of the dual damascene opening, is next addressed and schematically shown in FIG. 6. Photoresist shape 9, is used as an etch mask to allow a selective, anisotropic RIE procedure, to define trench shape component 10b, in overlying low k layer 5. The RIE procedure is performed using $CHF_3$ as an etchant for overlying low k layer 5, with the etching procedure terminating at the appearance of silicon nitride layer 4, resulting in narrow diameter via hole component 7, now defined in only silicon nitride layer 4, and in underlying low k layer 3. This desired selectivity is accomplished as a result of the high etch rate selectivity, or ratio, between low k layer 5, and silicon nitride. The etch rate ratio of HSQ to silicon nitride, using $CHF_3$ as a etchant, is between about 10 to 20, to 1. Silicon oxide which also exhibits a high etch rate in $CHF_3$ is also removed during the trench shape component, definition procedure. The portion of silicon oxide layer 8a, previously located at the bottom of via hole component 7, is removed, exposing a portion of lower level metal interconnect structure 2, while the portion of silicon oxide layer 8a, located on the top surface of overlying low k layer 5, and exposed in opening 10a, is also removed during this anisotropic, selective RIE procedure. The dry etching procedure used to define trench shape component, results in definition of LPD silicon oxide spacers 8b, on the sides of via hole component 7, where via hole component 7, now exists only in silicon nitride layer 4, and in underlying low k layer 3. Photoresist shape 9, is removed via plasma oxygen ashing and careful wet cleans.

Figure 7:
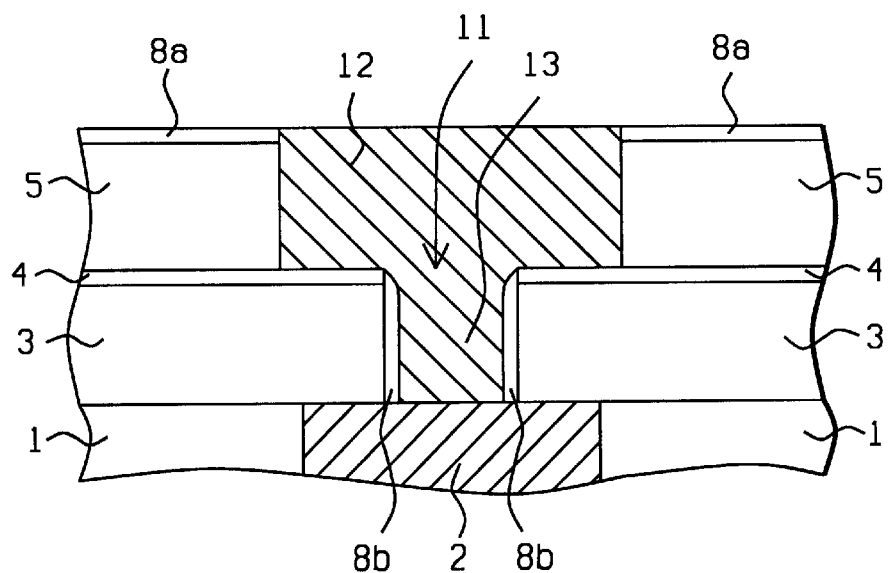

A copper structure, comprised of copper via structure 13, in the via hole component of the dual damascene opening, and comprised of copper interconnect structure 12, located in the trench shape component of the dual damascene opening, is next formed, and schematically shown in FIG. 7. A barrier layer, (not shown in the drawings), comprised of titanium nitride, or tantalum nitride, is first deposited via plasma vapour deposition procedures, at a thickness between about 200 to 1000 Angstroms. Next a copper.layer is either deposited using chemical vapour deposition (CVD), or obtained via electroplating procedures, to a thickness between about 1 to 10 um, completely filling the dual damascene opening. Regions of copper, and barrier layer, residing on the top surface of silicon oxide layer 8a, are removed using either a chemical mechanical polishing procedure, or via a selective RIE procedure, using $Cl_2$ as an etchant. The resulting dual damascene type copper structure, in the dual damascene opening in the composite low k layer, results in low interface resistance to underlying lower level metal interconnect structure 2, as a result of preventing via hole poisoning, via the use of LPD silicon oxide layer.

While this invention has been particularly shown and described with reference to, the preferred embodiments thereof, it will be understood by those skilled in the art that various changes in form and details may be made without departing from the spirit and scope of this invention.

What is claimed is:

1. A method of forming a dual damascene opening in low dielectric constant (low k) layers, on a semiconductor substrate, comprising the steps of:

providing a lower level metal interconnect structure;

forming a composite insulator layer on said lower level metal interconnect structure, comprised of an underlying low k layer, a stop layer, and an overlying low k layer;

forming a via opening in said composite insulator layer;

performing a liquid phase deposition procedure to form an undoped silicon oxide layer on the sides of said via opening;

forming a trench in said overlying low k layer, wherein said via opening is located below said trench, and with said via opening now comprised with liquid phase deposited undoped silicon oxide spacer; and forming a metal structure in said trench and in said via opening, with a metal via structure located in said via opening, contacting said underlying lower level metal interconnect structure.

2. The method of claim 1, wherein said underlying low k layer is comprised of hydrogen silsesquioxane (HSQ), applied at a thickness between about 3000 to 3000 Angstroms, via spin on procedures, and comprised with a dielectric constant between about 2.8 to 3.0.

3. The method of claim 1, where said stop layer is a silicon nitride layer, comprised with a thickness between about 50 to 500 Angstroms.

4. The method of claim 1, wherein said overlying low k layer is comprised of hydrogen silsesquioxane (HSQ), applied at a thickness between about 3000 to 30000 Angstroms, via spin on procedures, and comprised with a dielectric constant between about 2.8 to 3.0.

5. The method of claim 1, wherein said via opening is formed via an anisotropic RIE procedure using $CHF_3$ as an etchant for said underlying low k layer, while using $CF_4$ or $Cl_2$ as an etchant for said stop layer.

6. The method of claim 1, wherein the diameter of said via opening is between about 100 to 10000 Angstroms.

7. The method of claim 1, wherein said silicon oxide layer is obtained via a liquid phase deposition procedure, performed at room temperature in a solution of $H_2SiF_6$, titrating $H_3BO_3$ to precipitate silicon oxide.

8. The method of claim 1, wherein said silicon oxide layer is formed via liquid phase deposition procedures at a thickness between about 20 to 200 Angstroms.

9. The method of claim 1, wherein said trench is formed via a selective RIE procedure, using $CHF_3$ as an etchant for said overlying low k layer.

10. The method of claim 1, wherein the etch rate ratio of said overlying low k layer, to said stop layer, using $CHF_3$ as an etchant, is between about 10 to 20, to 1.

11. The method of claim 1, wherein said metal structure is copper structure.

12. A method of forming a dual damascene opening in low dielectric constant (low k), layers, comprising the steps of:

providing a lower level metal interconnect structure;

applying a first low k layer;

depositing a silicon nitride layer;

depositing a second low k layer;

performing a first dry etch procedure to form a via opening with a narrow diameter, between about 100 to 10,000 Angstroms, in said second low k layer, in said silicon nitride layer, and in said first low k layer, exposing a portion of the top surface of said lower level metal interconnect structure;

performing a liquid phase deposition procedure to form an undoped silicon oxide layer, between about 20 to 200 Angstroms, conformal with the inner surface of said via opening;

performing a second dry etch procedure to form a trench in said second low k layer, and in said silicon nitride layer, wherein said via opening is located below said trench, and with the diameter of said trench larger than the diameter of said via opening, and with liquid phase deposition, undoped silicon oxide spacers, formed on sides of said via opening; and forming a copper structure in said via opening and in said trench, with a copper via structure located in said via opening, overlying and contacting said lower level metal interconnect structure.

13. The method of claim 12, wherein said first low k layer is comprised of hydrogen silsesquioxane (HSQ), applied at a thickness between about 3000 to 30000 Angstroms, via spin on procedures, and comprised with a dielectric constant between about 2.8 to 3.0.

14. The method of claim 12, where said silicon nitride layer is obtained via PECVD procedures, to a thickness between about 50 to 500 Angstroms.

15. The method of claim 12, wherein said second low k layer is comprised of hydrogen silsesquioxane (HSQ), applied at a thickness between about 3000 to 30000 Angstroms, via spin on procedures, and comprised with a dielectric constant between about 2.8 to 3.0.

16. The method of claim 12, wherein said first dry etching procedure is an anisotropic RIE procedure, performed using $CHF_3$ as an etchant for said second, and for said first low k layer, while using $CF_4$ or $Cl_2$ as an etchant for said silicon nitride layer.

17. The method of claim 12, wherein said liquid phase deposition procedure is performed at room temperature, and carried out in a solution of $H_2SiF_6$, titrating $H_3BO_3$ to precipitate said silicon oxide layer.

18. The method of claim 12, wherein said second dry etch procedure is a selective RIE procedure, using $CHF_3$ as an etchant for said low k layer.

19. The method of claim 12, wherein the etch rate ratio of said second low k layer, to said silicon nitride layer, using $CHF_3$ as an etchant, is between about 10 to 20, to 1.

* * * * *